(12) United States Patent
Tokairin et al.

(10) Patent No.: US 9,350,363 B2
(45) Date of Patent: May 24, 2016

(54) VOLTAGE CONTROLLED OSCILLATOR CIRCUIT AND FREQUENCY SYNTHESIZER

(71) Applicant: KABUSHIKI KAISHA TOSHIBA, Tokyo (JP)

(72) Inventors: Takashi Tokairin, Kawasaki Kanagawa (JP); Hideaki Masuoka, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/475,393

(22) Filed: Sep. 2, 2014

(65) Prior Publication Data

US 2015/0236707 A1 Aug. 20, 2015

(30) Foreign Application Priority Data

Feb. 18, 2014 (JP) ................... 2014-028467

(51) Int. Cl.
| | |
|---|---|
| H03L 7/22 | (2006.01) |
| H03L 7/093 | (2006.01) |
| H03L 7/099 | (2006.01) |
| H03L 7/10 | (2006.01) |
| H03L 7/187 | (2006.01) |

(52) U.S. Cl.
CPC ............. *H03L 7/093* (2013.01); *H03L 7/099* (2013.01); *H03L 7/102* (2013.01); *H03L 7/187* (2013.01)

(58) Field of Classification Search
CPC ....................................................... H03L 7/22
USPC ............................................................ 331/8, 17
See application file for complete search history.

(56) References Cited

U.S. PATENT DOCUMENTS

| 5,056,144 A | 10/1991 | Cornelius |
| 2009/0289723 A1 | 11/2009 | Maeda et al. |
| 2013/0106476 A1* | 5/2013 | Joubert ............... H03L 1/00 327/156 |

FOREIGN PATENT DOCUMENTS

| JP | H02-305024 A | 12/1990 |
| JP | 2000-261248 A | 9/2000 |
| JP | 2001-136030 A | 5/2001 |
| JP | 2006-197571 A | 7/2006 |
| JP | 2009-182918 A | 8/2009 |

* cited by examiner

*Primary Examiner* — Joseph Chang
(74) *Attorney, Agent, or Firm* — Patterson & Sheridan, LLP

(57) ABSTRACT

According to one embodiment, a voltage-controlled oscillation (VCO) circuit includes a current source, an oscillation core unit, an amplitude detection unit, a current control unit, a low pass filter, and a switch. The current source supplies a bias current to the oscillation core unit in accordance with a current control signal. The oscillation core unit oscillates according to the bias current and outputs an oscillation signal. The amplitude detection unit outputs a detection voltage according to an amplitude of the oscillation signal. The current control unit outputs a control signal so that the detection voltage is equal to a reference voltage. The low pass filter generates the current control signal by filtering the control signal, and then supplies the current control signal to the current source. The switch is connected in parallel with the low pass filter.

17 Claims, 3 Drawing Sheets

VOLTAGE CONTROLLED OSCILLATOR CIRCUIT AND FREQUENCY SYNTHESIZER

CROSS-REFERENCE TO RELATED APPLICATION

This application is based upon and claims the benefit of priority from Japanese Patent Application No. 2014-028467, filed Feb. 18, 2014, the entire contents of which are incorporated herein by reference.

FIELD

Embodiments described herein relate generally to a VCO circuit and a frequency synthesizer.

BACKGROUND

In a voltage controlled oscillator (VCO) circuit that includes an amplitude adjustment unit that adjusts an amplitude of an oscillation signal to a target amplitude, a phase noise of the oscillation signal is degraded by the influence of noise from the amplitude adjustment unit. However, when the noise of the amplitude adjustment unit is decreased by using a narrow band filter to improve the phase noise, it takes a long time to stabilize the amplitude of the oscillation signal.

DETAILED DESCRIPTION

One or more embodiments described herein provide a VCO circuit and a frequency synthesizer that improves a phase noise and rapidly stabilizes an amplitude of an oscillation signal.

In general, according to one embodiment, a VCO circuit includes a current source, an oscillation core unit, an amplitude detection unit, a current control unit, a low pass filter, and a switch. The current source supplies a bias current to the oscillation core unit in accordance with a current control signal. The oscillation core unit oscillates according to the bias current and outputs an oscillation signal. The amplitude detection unit outputs a detection voltage according to an amplitude of the oscillation signal. The current control unit outputs a control signal so that the detection voltage is equal to a reference voltage. The low pass filter generates the current control signal by filtering the control signal, and supplies the current control signal to the current source. The switch is connected in parallel with the low pass filter.

One or more embodiments are described herein with reference to the drawings. Further embodiments are contemplated.

First Embodiment

Figure 1:
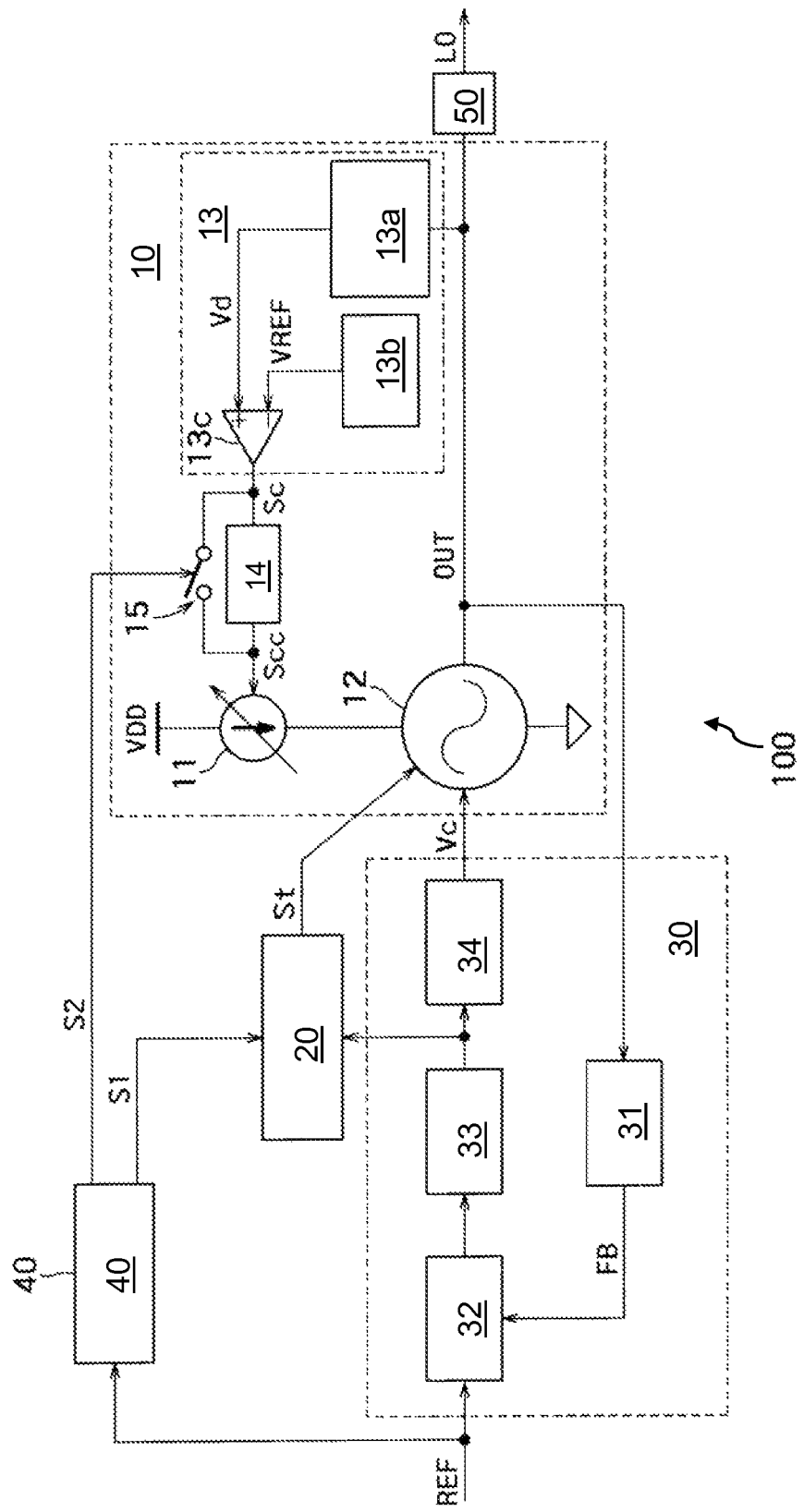
FIG. 1 is a block diagram illustrating a configuration of a frequency synthesizer according to a first embodiment.

FIG. 1 is a block diagram illustrating a configuration of a frequency synthesizer 100 according to a first embodiment.

As illustrated in FIG. 1, the frequency synthesizer 100 includes a VCO circuit 10, a coarse adjustment circuit 20, a PLL circuit 30, a control unit 40, and a local signal transmission circuit 50. In embodiments, the frequency synthesizer 100 may be configured as a semiconductor integrated circuit.

The VCO circuit 10 is configured to control a frequency of an oscillation signal OUT. Specifically, the VCO circuit 10 finely controls the frequency of the oscillation signal OUT according to a control voltage Vc, and coarsely controls the frequency of the oscillation signal OUT according to the coarse adjustment signal St.

The VCO circuit 10 includes a current source 11, an oscillation core unit 12, an amplitude adjustment unit 13, a low pass filter 14, and a switch 15.

A current source 11 includes one terminal to which a power supply voltage VDD is supplied, and another terminal from which a bias current having a value in accordance with a current control signal Scc is output. In the present embodiment, the current source 11 includes a PMOS transistor that outputs the bias current. The current control signal Scc is a voltage signal, and is supplied to a gate of the PMOS transistor.

The oscillation core unit 12 performs an oscillation operation according to the bias current supplied from the current source 11, and outputs the oscillation signal OUT. According to embodiments, the oscillation core unit 12 includes a plurality of capacitors (not illustrated) for determining the frequency of the oscillation signal OUT, switches the capacitors according to the coarse adjustment signal St, and controls the frequency of the oscillation signal OUT. That is, in a control operation performed by the coarse adjustment signal St, the frequency of the oscillation signal OUT is changed in a discrete manner. In contrast, in a control operation performed by the control voltage Vc, the frequency of the oscillation signal is changed in a continuous manner.

The oscillation core unit 12 increases an amplitude of the oscillation signal OUT based on an increase in the bias current, and decreases the amplitude of the oscillation signal OUT based on a decrease in the bias current.

The amplitude adjustment unit 13 outputs the control signal Sc such that the amplitude of the oscillation signal OUT approaches a target amplitude. Specifically, when the amplitude of the oscillation signal OUT is smaller than the target amplitude, the amplitude adjustment unit 13 decreases the control signal Sc, thereby increasing the bias current. In addition, when the amplitude of the oscillation signal OUT is larger than the target amplitude, the amplitude adjustment unit 13 increases the control signal Sc, thereby decreasing the bias current.

By such controls, even when a target frequency of the oscillation signal OUT, or a process, a power supply voltage, or a temperature (PVT) is changed, the amplitude of the oscillation signal OUT becomes a constant target amplitude, and thus, the degradation of a phase noise due to a decrease of the amplitude of the oscillation signal OUT is reduced. That is, even when the target frequency or the PVT is changed, a relatively stable phase noise may be obtained.

The amplitude adjustment unit 13 includes an amplitude detection unit 13a, a reference voltage generation unit 13b, and a comparator (voltage control unit) 13c. The amplitude detection unit 13a outputs a detection voltage Vd according to the amplitude of the oscillation signal OUT. For example, the detection voltage Vd may be proportional to the amplitude of the oscillation signal OUT. The reference voltage generation unit 13b generates a predetermined reference voltage VREF. The comparator 13c outputs the control signal Sc such that the detection voltage Vd is equal to the reference voltage VREF. Thus, by changing the reference voltage VREF, the target amplitude may be changed.

The low pass filter 14 is connected between the current source 11 and the comparator 13c of the amplitude adjustment unit 13, and supplies a current control signal Scc in which the control signal Sc is filtered prior to being supplied to the current source 11. That is, the low pass filter 14 removes a noise of the control signal Sc. For example, the noise of the control signal Sc includes a noise of the amplitude detection unit 13a, a noise of the reference voltage generation unit 13b, and a noise of the comparator 13c. In embodiments, the low pass filter 14 may be configured with a resistor and a capacitor.

A cut-off frequency of the low pass filter 14 may be appropriately adjusted according to an offset frequency of the phase noise that is expected to decrease. The cut-off frequency is required to be decreased by an amount that the offset frequency of the phase noise decreases, and a response time of the current control signal Scc becomes long when the control signal Sc is changed. For example, when the offset frequency of the phase noise which is expected to decrease is in the range from approximately 100 kHz to approximately 10 MHz, the cut-off frequency may be set such that the noise of the current control signal Scc within this frequency range may be decreased.

The switch 15 is connected in parallel to the low pass filter 14, and causes the control signal Sc to bypass the low pass filter 14 when the switch is on. That is, when switch 15 is on, switch 15 supplies the control signal Sc directly to the current source 11 as the current control signal Scc.

The coarse adjustment circuit 20 controls a coarse adjustment signal St which is supplied to the VCO circuit 10, and performs a coarse adjustment of the frequency of the oscillation signal OUT to a target frequency.

The PLL circuit 30 controls the control voltage Vc that is supplied to the VCO circuit 10, and performs a fine adjustment of the frequency of the oscillation signal OUT to the target frequency. In the embodiment depicted, if the coarse adjustment circuit 20 finishes the coarse adjustment, the PLL circuit 30 performs the fine adjustment.

The PLL circuit 30 includes a divider (DIV) 31, a phase detector (PD) 32, a charge pump (CP) 33, and a loop filter (LF) 34.

The divider 31 divides the oscillation signal OUT of the VCO circuit 10 and generates a feedback signal FB. The phase detector 32 compares a phase of the feedback signal FB with a phase of the reference signal REF, and outputs a signal according to the compared result. The charge pump 33 generates an output voltage according to an output signal of the phase detector 32. The loop filter 34 smoothes the output voltage of the charge pump 33 and generates the control voltage Vc.

Although, in the embodiment depicted in FIG. 1, the coarse adjustment circuit 20 performs the coarse adjustment using the output voltage of the charge pump 33, other embodiments are not limited in this manner.

The control unit 40 causes the coarse adjustment circuit 20 to perform the coarse adjustment during a predetermined coarse adjustment period using a coarse adjustment control signal S1. After coarse adjustment is performed, control unit 40 causes the PLL circuit 30 to perform the fine adjustment. For example, the control unit 40 may be configured with a counter which counts the coarse adjustment period based on the reference signal REF.

The control unit 40 controls the switch 15 so as to turn the switch to an on state from an off state, and then controls the switch 15 to turn the switch back to the off state within the coarse adjustment period, using a switch control signal S2. According to embodiments, it is preferable for the control unit 40 to control the switch 15 to turn the switch from off to on at a start time of the coarse adjustment period. The reason for this is that it is preferable that, after the coarse adjustment period is started, the amplitude of the oscillation signal OUT be adjusted to the target amplitude as soon as possible. In addition, after the amplitude of the oscillation signal OUT reaches the target amplitude, the control unit 40 turns the switch 15 off. In addition, the control unit 40 controls the switch 15 so as to turn the switch from on to off once within the coarse adjustment period, and then maintains the switch 15 in an OFF state.

The local signal transmission circuit 50 outputs a local signal LO based on the oscillation signal OUT. The local signal transmission circuit 50 outputs the local signal LO such that the frequency of the local signal LO can be the same as or different from the frequency of the oscillation signal OUT.

Figure 2:
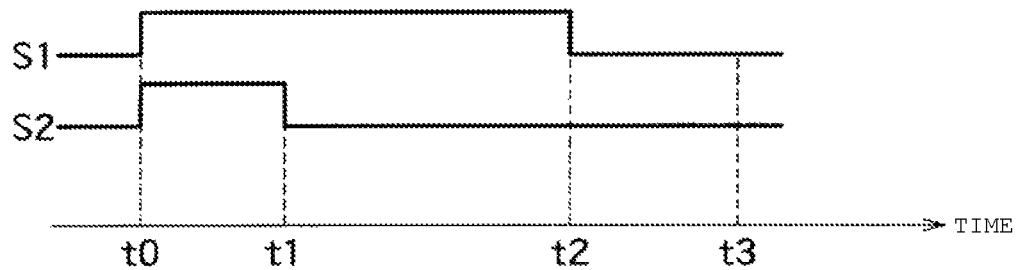
FIG. 2 is a timing diagram illustrating a control timing of the frequency synthesizer illustrated in FIG. 1.

FIG. 2 is a timing diagram illustrating a control timing of the frequency synthesizer 100 illustrated in FIG. 1.

To begin with, at a time t0, such as when the reset of the frequency synthesizer 100 is released, the coarse adjustment control signal S1 changes from a low level to a high level. As a result, the coarse adjustment circuit 20 starts operating, and the coarse adjustment of the frequency of the oscillation signal OUT is performed.

In addition, at a time t0, a switch control signal S2 changes from a low level to a high level, and the switch 15 is turned on. As a result, the low pass filter 14 is bypassed, and thus the amplitude of the oscillation signal OUT is rapidly adjusted to the target amplitude before the time t1.

Then, at time t1, the switch control signal S2 changes from a high level to a low level, and the switch 15 is turned off. As a result, the noise of the control signal Sc is suppressed by the low pass filter 14 with a narrow band, and the current control signal Scc with the resultant low noise is supplied to the current source 11. Thus, the bias current also has a low noise, and the phase noise of the oscillation signal OUT also becomes low.

At time t1, the switch 15 is turned from on to off, and therefore there is a possibility that the current control signal Scc is changed. Because of this, there is a possibility that small variations of the amplitude and frequency of the oscillation signal OUT occur. However, at time t1, the coarse adjustment of the frequency of the oscillation signal OUT is performed, and thus, a small frequency variation of the oscillation signal OUT is absorbed by the coarse adjustment. Furthermore, the current control signal Scc is supplied to the gate of the PMOS transistor of the current source 11, and thus, only a leakage current flows in the low pass filter 14 or the switch 15. Due to this, the variation of the current control signal Scc due to switching of the switch 15 becomes sufficiently small.

At a time t2, the coarse adjustment control signal S1 changes from a high level to a low level. As a result, the coarse adjustment circuit 20 stops operating, and after time t2, the PLL circuit 30 performs the fine adjustment of the frequency of the oscillation signal OUT. That is, in the example of FIG. 2, the coarse adjustment period is a period from time t0 to time t2.

Then, at a time t3, the frequency of the oscillation signal OUT is almost equal to the target frequency. That is, in this example, a lock-up time is a time between the time t0 and the time t3.

Since after the time t1 the switch 15 is maintained in an OFF state, the oscillation signal OUT having the target frequency with a low phase noise may be obtained after the time t3.

Figure 3:
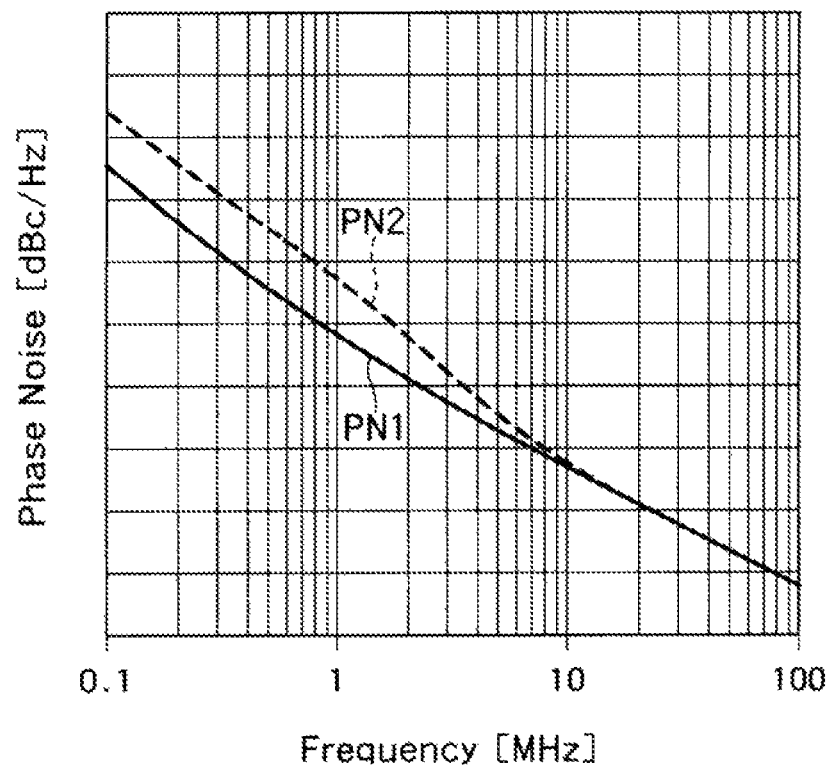
FIG. 3 is a graph illustrating a frequency characteristic of a phase noise of the VCO circuit illustrated in FIG. 1.

FIG. 3 is a graph illustrating a frequency characteristic of a phase noise of the VCO circuit 10 illustrated in FIG. 1. As illustrated in FIG. 3, the phase noise PN1, when the switch 15 is in an off state, is improved in a frequency offset range from approximately 100 kHz to approximately 10 MHz, as compared with the phase noise PN2, which corresponds to when the switch 15 is in anon state. The phase noise PN2 when the switch 15 is in an on state is equal to the phase noise when the low pass filter 14 is not present.

Thus, according to the present embodiment, the VCO circuit 10 includes the low pass filter 14 which supplies the current control signal Scc, where current control signal Scc is obtained by filtering the control signal Sc prior to supplying the signal to the current source 11, and where the switch 15 is connected in parallel to the low pass filter 14. As a result, at an initial time, by turning the switch 15 on, the control signal Sc bypasses the low pass filter 14, and therefore the amplitude of the oscillation signal OUT is rapidly stabilized. Then, by turning the switch 15 off, the noise of the current control signal Scc is decreased by the low pass filter 14, and therefore the phase noise of the oscillation signal OUT may be decreased. Thus, the phase noise may be improved and the amplitude of the oscillation signal OUT may be rapidly stabilized.

In addition, the amplitude adjustment unit 13 has a simple configuration and a relatively small current consumption.

Further, since the amplitude of the oscillation signal OUT in the VCO circuit 10 may be rapidly stabilized, it is not necessary to lengthen the coarse adjustment period of the frequency synthesizer 100. Thus, there is no concern that the lock-up time becomes long.

In addition, the current source 11 may be installed between the oscillation core unit 12 and ground. In addition, the depicted configuration of the amplitude adjustment unit 13 or the PLL circuit 30 is in accordance with one embodiment. It should be noted that configurations other than the one depicted, and which obtain equivalent results, are contemplated.

Hereinafter, the frequency synthesizer of a comparison example will be described. The frequency synthesizer of the comparison example is different from that of the first embodiment in that the switch 15 is not installed. In this case, while the phase noise of the oscillation signal OUT is similar to that of the first embodiment, the time it takes for the current control signal Scc to be stabilized by the low pass filter 14 is longer than that of the first embodiment.

Thus, the time when the amplitude of the oscillation signal OUT is stabilized to the target amplitude is prolonged to time t2 of FIG. 2, for example. As a result, since the amplitude of the oscillation signal OUT continues to change during the coarse adjustment, the coarse adjustment becomes unstable and does not finish at time t2. For this reason, it is necessary to perform the coarse adjustment for a time beyond time t2. Thus, in the comparison example, the lock-up time is longer than that of the present embodiment.

Second Embodiment

A second embodiment relates to a wireless communication device 500 which includes the frequency synthesizer 100 of the first embodiment.

Figure 4:
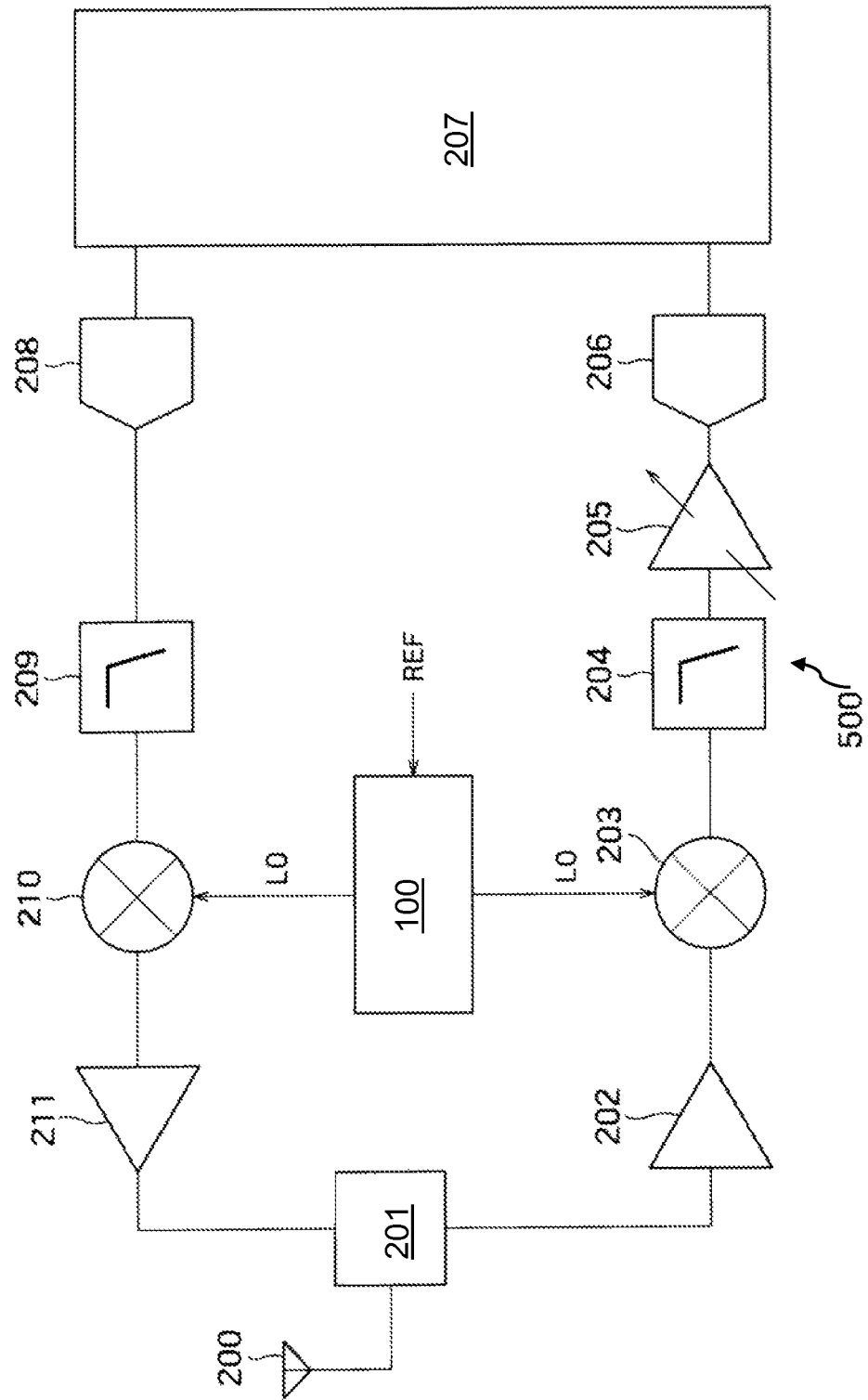
FIG. 4 is a block diagram of a wireless communication device that includes the frequency synthesizer illustrated in FIG. 1.

FIG. 4 is a block diagram of a wireless communication device 500 that includes the frequency synthesizer 100 illustrated in FIG. 1. As illustrated in FIG. 4, a wireless communication device 500 includes the frequency synthesizer 100, an antenna 200, a switch 201, a low noise amplifier 202, a mixer 203, a filter 204, a variable gain amplifier (VGA) 205, an A/D converter 206, a signal processing unit 207, a D/A converter 208, a filter 209, a mixer 210, and a power amplifier 211.

As illustrated in the first embodiment, the frequency synthesizer 100 generates a local signal LO based on the reference signal REF.

The antenna 200 receives a receipt signal of a wireless frequency, and transmits a transmission signal of the wireless frequency. When receiving, the switch 201 supplies the receipt signal received from the antenna 200 to the low noise amplifier 202. The low noise amplifier 202 amplifies the receipt signal, which is supplied from the switch 201, with a low level of noise. The mixer 203 converts a frequency of an output signal of the low noise amplifier 202 using the local signal LO, and decreases the frequency more than that of the receipt signal. The filter 204 limits a band of an output signal of the mixer 203. The variable gain amplifier 205 amplifies an output signal of the filter 204. A gain of the variable gain amplifier 205 is variable, and an amplitude of an output signal of the variable gain amplifier 205 is adjusted so as to be almost constant. The A/D converter 206 converts an output signal of the variable gain amplifier 205 into a digital signal. The signal processing unit 207 performs signal processing of the digital signal that is supplied from the A/D converter 206, thereby obtaining receipt data.

In addition, the signal processing unit 207 outputs a digital signal that is obtained by performing signal processing of transmission data. The D/A converter 208 converts the digital signal that is output from the signal processing unit 207 into an analog signal. The filter 209 limits a band of the analog signal output from the D/A converter 208. The mixer 210 converts a frequency of an output signal of the filter 209 using the local signal LO and outputs the converted signal as a signal of a wireless frequency. The power amplifier 211 supplies a transmission signal which is obtained by amplifying a power of an output signal of the mixer 210 to the switch 201. When transmitting, the switch 201 supplies the transmission signal that is supplied from the power amplifier 211 to the antenna 200.

According to the second embodiment, since the wireless communication device 500 includes the frequency synthesizer 100 of the first embodiment, the phase noise of the local signal LO is decreased, and the switching of the frequency of the local signal LO is done at a high speed. Thus, wireless communication performance may be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage-controlled oscillation (VCO) circuit connected to a coarse adjustment circuit configured to perform a coarse adjustment of a frequency of an oscillation signal to a target frequency, a phase-locked loop (PLL) circuit configured to perform a fine adjustment of the frequency of the oscillation signal to the target frequency, and a control unit configured to cause the coarse adjustment circuit to perform the coarse adjustment during a predetermined coarse adjustment period and the PLL circuit to perform the fine adjustment at a time after the performance of the coarse adjustment, said VCO circuit comprising:
- a current source configured to supply a bias current in accordance with a current control signal;
- an oscillation core unit configured to oscillate in accordance with the bias current and to output the oscillation signal;
- an amplitude detection unit configured to output a detection voltage in accordance with an amplitude of the oscillation signal;
- a current control unit configured to output a control signal so that the detection voltage is equal to a reference voltage;
- a low pass filter configured to filter the control signal to generate the current control signal and to supply the current control signal to the current source; and
- a switch that is connected in parallel with the low pass filter, wherein the switch is controlled within the coarse adjustment period to turn to an on state from an off state and to turn back to the off state.

2. The circuit according to claim 1, further comprising:
a reference voltage generator configured to supply the reference voltage to the current control unit.

3. The circuit according to claim 1, wherein the control signal bypasses the low pass filter and is supplied to the current source when the switch is in the on state.

4. The circuit according to claim 1, wherein the oscillation core unit is configured to receive a coarse adjustment signal, a frequency of the oscillation signal being coarsely adjusted according to the coarse adjustment signal.

5. The circuit according to claim 1, wherein the oscillation core unit is configured to receive a control voltage from the phase-locked loop (PLL) circuit, the frequency of the oscillation signal being finely adjusted according to the control voltage.

6. The circuit according to claim 1, wherein the low pass filter comprises a capacitor and a resistor.

7. A frequency synthesizer comprising:
- a voltage-controlled oscillation (VCO) circuit that is configured to control a frequency of an oscillation signal;
- a coarse adjustment circuit configured to perform a coarse adjustment of a frequency of the oscillation signal to a target frequency;
- a phase-locked loop (PLL) circuit configured to perform a fine adjustment of the frequency of the oscillation signal to the target frequency; and
- a control unit configured to cause the coarse adjustment circuit to perform the coarse adjustment during a predetermined coarse adjustment period, and to cause the PLL circuit to perform the fine adjustment at a time after the performance of the coarse adjustment,
wherein the VCO circuit includes:
a current source configured to supply a bias current according to a current control signal;
an oscillation core unit configured to oscillate according to the bias current and to output the oscillation signal;
an amplitude adjustment unit configured to output a control signal so that an amplitude of the oscillation signal approaches a target amplitude;
a low pass filter configured to generate the current control signal by filtering the control signal and supplying the current control signal to the current source; and
a switch that is connected in parallel with the low pass filter, wherein the control unit is configured to control the switch within the coarse adjustment period to turn to an on state from an off state and to turn back to the off state.

8. The synthesizer according to claim 7, wherein the control unit is configured to control the switch to turn to the on state from the off state at a start time of the coarse adjustment period.

9. The synthesizer according to claim 8, wherein the control unit is configured to control the switch to turn to the off state from the on state once within the coarse adjustment period, and then to maintain the switch in the off state.

10. The synthesizer according to claim 7, wherein the control signal bypasses the low pass filter when the switch is in the on state.

11. The synthesizer according to claim 7, wherein the PLL circuit includes a divider, a phase detector, a charge pump, and a loop filter.

12. The synthesizer of claim 7, wherein the amplitude adjustment unit comprises:
- an amplitude detection unit configured to output a detection voltage according to an amplitude of the oscillation signal;
- a current control unit configured to output a control signal so that the detection voltage is equal to a reference voltage; and
- a reference voltage generator configured to supply the reference voltage to the current control unit.

13. The circuit according to claim 7, wherein the low pass filter includes a capacitor and a resistor.

14. A method of controlling a frequency of an oscillation signal generated by a voltage-controlled oscillation (VCO) circuit, said method comprising:
- generating a first control signal for a current source of the VCO circuit from a control signal by passing the control signal through a first path, the first path including a low-pass filter;
- generating a second control signal for the current source of the VCO circuit from the control signal by passing the control signal through a second path that bypasses the low-pass filter;
- determining start and end times of a coarse adjustment period;
- coarsely adjusting the frequency of the oscillation signal based on a coarse adjustment signal during said coarse adjustment period; and
- responsive to determining that the frequency of the oscillation signal has been coarsely adjusted, finely adjusting the frequency of the oscillation signal using a phase-locked loop (PLL) circuit to a target frequency,
wherein the second control signal and then the first control signal are generated within the coarse adjustment period.

15. The method of claim 14, wherein the first control signal is generated when a switch connected in parallel with the low-pass filter is in an open position, and the second control signal is generated when said switch is in a closed position.

16. The method of claim 15, further comprising:
- generating, by the current source, a bias current based on one of the first and second control signals; and
- supplying the bias current to an oscillation core unit.

17. The method of claim 16, further comprising:
- generating, by the oscillation core unit, the oscillation signal based on the bias current.

* * * * *